US012782412B2

(12) United States Patent
Yu et al.

(10) Patent No.: US 12,782,412 B2
(45) Date of Patent: Nov. 3, 2026

(54) METHOD AND APPARATUS FOR EVALUATING INSULATION PERFORMANCE OF SUBMARINE CABLE, AND MEDIUM

(71) Applicant: ELECTRIC POWER RESEARCH INSTITUTE OF GUANGDONG POWER GRID CO., LTD., Guangzhou (CN)

(72) Inventors: Xin Yu, Guangzhou (CN); Ji Wu, Guangzhou (CN); Shihu Yu, Guangzhou (CN); Xiangyang Peng, Guangzhou (CN); Zhong'ao Wang, Guangzhou (CN); Yazhou Fan, Guangzhou (CN); Zhangquan Rao, Guangzhou (CN); Yinge Li, Guangzhou (CN); Zheng Wang, Guangzhou (CN); Bing Zhao, Guangzhou (CN); Rui Wang, Guangzhou (CN); Jianping Huang, Guangzhou (CN); Yuan Zhou, Guangzhou (CN); Li Li, Guangzhou (CN); Dongsheng Zhao, Guangzhou (CN)

(73) Assignee: ELECTRIC POWER RESEARCH INSTITUTE OF GUANGDONG POWER GRID CO., LTD., Guangzhou (CN)

( * ) Notice: Subject to any disclaimer, the term of this patent is extended or adjusted under 35 U.S.C. 154(b) by 128 days.

(21) Appl. No.: 19/050,134

(22) Filed: Feb. 11, 2025

(65) Prior Publication Data

US 2025/0180625 A1 Jun. 5, 2025

Related U.S. Application Data

(63) Continuation-in-part of application No. PCT/CN2024/105103, filed on Jul. 12, 2024.

(30) Foreign Application Priority Data

Nov. 28, 2023 (CN) ........................ 202311602888.1

(51) Int. Cl.
*G01R 31/12* (2020.01)
*G01R 27/02* (2006.01)

(52) U.S. Cl.
CPC ........ *G01R 31/1272* (2013.01); *G01R 27/025* (2013.01)

(58) Field of Classification Search
CPC .......................... G01R 31/1272; G01R 27/025
See application file for complete search history.

(56) References Cited

U.S. PATENT DOCUMENTS

| | | | | |
|---|---|---|---|---|
| 2,837,714 A * | 6/1958 | Hill | G01R 31/14 | 324/551 |
| 3,771,049 A * | 11/1973 | Piccione | G01R 31/58 | 324/543 |

(Continued)

OTHER PUBLICATIONS

Translation of CN-116087717-A (Year: 2023).*

*Primary Examiner* — Paresh Patel

(57) ABSTRACT

Provided are a method and apparatus for evaluating insulation performance of a submarine cable, and a medium. The method includes: obtaining a first measured dielectric loss value, first current-limiting resistance, and first insulation resistance of a submarine cable; substituting the above parameters into an expression of the first measured dielectric loss value to calculate a first actual dielectric loss value, where the expression of the first measured dielectric loss value is calculated based on a preset expression of a total dielectric loss value, and the expression of the total dielectric loss value includes a first product and the to-be-solved first actual dielectric loss value; and evaluating insulation performance of the submarine cable based on the first actual dielectric loss value to obtain an insulation performance (Continued)

evaluation result. The present disclosure can solve a problem of low reliability of the insulation performance evaluation result of the submarine cable.

17 Claims, 3 Drawing Sheets

(56) References Cited

U.S. PATENT DOCUMENTS

| | | | | |
|---|---|---|---|---|
| 7,658,808 | B2 * | 2/2010 | Bertini ................. | G09B 23/181 156/48 |
| 2009/0323233 | A1 * | 12/2009 | Shoemaker .......... | G01R 27/025 361/42 |

* cited by examiner

METHOD AND APPARATUS FOR EVALUATING INSULATION PERFORMANCE OF SUBMARINE CABLE, AND MEDIUM

CROSS REFERENCE TO RELATED APPLICATIONS

The present application is a Continuation-In-Part Application of PCT Application No. PCT/CN2024/105103 filed on Jul. 12, 2024, which claims the benefit of Chinese Patent Application No. 202311602888.1 filed on Nov. 28, 2023. All the above are hereby incorporated by reference in their entirety.

TECHNICAL FIELD

The present disclosure relates to the technical field of insulation status evaluation of cables, and in particular, to a method and apparatus for evaluating insulation performance of a submarine cable, and a medium.

BACKGROUND

A submarine cable plays an extremely important role in transmission of electrical energy in a power system. As usage time of the submarine cable increases and the submarine cable is eroded by a harsh submarine environment, insulation performance of the submarine cable will gradually decrease. As a result, an operating life of the submarine cable is likely to be shorter than a service life designed for the submarine cable. Therefore, it is particularly important to evaluate an insulation status of the submarine cable. When evaluating the insulation performance of the submarine cable based on a dielectric loss value of the submarine cable, the prior art mainly uses a polarization-depolarization current (PDC) method to apply a voltage that is approximately a step signal to the submarine cable to conduct a test to obtain a measured dielectric loss value, and evaluates the insulation performance based on the measured dielectric loss value.

However, a length of the submarine cable usually ranges from a few kilometers to tens of kilometers, with large capacitance. As the cable length increases, the cable capacitance gradually increases, such that the voltage applied to the submarine cable during the test is not a voltage that is approximately the step signal, but a voltage that is approximately an exponential signal. As a result, the measured dielectric loss value is too large, and there is a significant deviation in an insulation performance evaluation result of the submarine cable, which is unreliable.

SUMMARY

The present disclosure provides a method and apparatus for evaluating insulation performance of a submarine cable, and a medium, in order to avoid an inaccurate insulation performance evaluation result of a submarine cable due to a too large dielectric loss value measured during insulation performance evaluation of the submarine cable.

To solve the above problem, the present disclosure provides a method for evaluating insulation performance of a submarine cable, including:

obtaining a first measured dielectric loss value, first current-limiting resistance, and first insulation resistance of a submarine cable;

substituting the first measured dielectric loss value, the first current-limiting resistance, and the first insulation resistance into an expression of the first measured dielectric loss value to calculate a first actual dielectric loss value, where the expression of the first measured dielectric loss value is calculated based on a preset expression of a total dielectric loss value, the expression of the total dielectric loss value includes a first product and the to-be-solved first actual dielectric loss value, the first product is calculated by a preset model in an $n^{th}$-order situation, the $n^{th}$-order situation represents that there are n branches in the submarine cable, and the n is a natural number; and evaluating insulation performance of the submarine cable based on the first actual dielectric loss value to obtain an insulation performance evaluation result, and correspondingly controlling an operating status of the submarine cable based on the insulation performance evaluation result.

The present disclosure obtains the first actual dielectric loss value by substituting the obtained first measured dielectric loss value, first current-limiting resistance, and first insulation resistance into the pre-calculated expression of the first measured dielectric loss value, and then evaluates the insulation performance of the submarine cable based on the first actual dielectric loss value to obtain the evaluation result. This evaluation method is simple, fast, efficient, and convenient. The expression of the total dielectric loss value includes the first product and the to-be-solved first actual dielectric loss value. The first product is calculated by the preset model and is substituted into the expression of the total dielectric loss value to obtain the expression of the first measured dielectric loss value. At this time, the expression of the first measured dielectric loss value contains the to-be-solved first actual dielectric loss value. The expression of the first measured dielectric loss value is actually a combination of the first actual dielectric loss value and "a parameter that causes a too large measured dielectric loss value". Therefore, the first actual dielectric loss value can be obtained through inverse solving, provided that the related data is substituted into the expression of the first measured dielectric loss value. This solving method is simple and fast, and ensures accuracy of the first actual dielectric loss value after too large data is removed. In this way, the result of evaluating the insulation performance of the submarine cable based on the first actual dielectric loss value is highly accurate. Compared with the prior art, the present disclosure obtains the first actual dielectric loss value by eliminating a data deviation in the first measured dielectric loss value, and then evaluates the insulation performance of the submarine cable based on the first actual dielectric loss value, which can ensure high accuracy of the first actual dielectric loss value. On this basis, a high-precision insulation performance evaluation result of the submarine cable is obtained, thereby solving a problem of low reliability of the insulation performance evaluation result of the submarine cable.

As a preferred solution, the expression of the first measured dielectric loss value is calculated based on a preset expression of a total dielectric loss value is specifically as follows:

establishing an expression related to a frequency domain and impedance based on first preset data, and performing formula transformation on the expression related to the frequency domain and the impedance to obtain an initial frequency domain admittance expression, where the first preset data includes a preset first measured dielectric loss value, preset total cable resistance, preset total cable capacitance, preset current-limiting resistance, an imaginary unit, an angular frequency under a direct current, and preset insulation resistance that are of the submarine cable;

transforming the initial frequency domain admittance expression into a complex number algebraic form to obtain a first frequency domain admittance expression containing a first real part and a first imaginary part; and calculating the expression of the total dielectric loss value based on the first real part and the first imaginary part, and substituting a value of the first product into the expression of the total dielectric loss value to calculate the expression of the first measured dielectric loss value; where the first product is a product of the first real part and the preset current-limiting resistance.

In this preferred solution, a reason for establishing the expression related to the frequency domain and the impedance based on the first preset data is that many parameters are eliminated after the expression related to the frequency domain and the impedance is transformed into the initial frequency domain admittance expression and further transformation processing is performed on the initial frequency domain admittance expression. Therefore, establishing the expression related to the frequency domain and the impedance based on the first preset data can save manpower resources required to obtain data.

As a preferred solution, the first product is calculated by a preset model in an $n^{th}$-order situation is specifically as follows:

calculating the first product in the $n^{th}$-order situation by a Debye model, where the first product is as follows:

$$AR = \frac{R}{R_0} + \sum_{1}^{n} \frac{\omega^2 C_i^2 R_i R}{1 + \omega^2 C_i^2 R_i^2} = \frac{R}{R_0} + \sum_{1}^{n} \frac{\omega^2 C_i^2 R_i R}{1 + \omega^2 C_i^2 R_i^2} \cdot \frac{R_i}{R_i} \approx \frac{R}{R_{DC}}$$

where A represents the first real part, $R_0$, R, ω, and $R_{DC}$ respectively represent the preset total cable resistance, the preset current-limiting resistance, the angular frequency, and the preset insulation resistance in the first preset data, and $C_i$ and $R_i$ respectively represent equivalent capacitance and equivalent resistance of an $i^{th}$ branch in the submarine cable.

This preferred solution uses the Debye model to calculate the first product of the first real part and the preset current-limiting resistance in the $n^{th}$-order situation. In this case, the Debye model is equivalent to an equivalent model of the submarine cable, which can be used to cover all possible branch situations of the submarine cable, and can quickly and accurately calculate the first product of the first real part and the preset current-limiting resistance in different branch situations.

As a preferred solution, the expression of the total dielectric loss value is specifically as follows:

$$\tan\delta_{total} = (AR + 1)\tan\delta + \frac{AR}{\tan\delta}$$

where tan $\delta_{total}$ represents the preset first measured dielectric loss value, AR represents the first product, and tan δ represents the to-be-solved first actual dielectric loss value.

As a preferred solution, the initial frequency domain admittance expression is specifically as follows:

$$G(\omega) = \frac{R_0 + R + \omega^2 C_0^2 R_0^2 R + j\omega C_0 R_0^2}{(R_0 + R)^2 + \omega^2 C_0^2 R_0^2 R^2}$$

where $R_0$, $C_0$, R, ω, and j respectively represent the preset total cable resistance, the preset total cable capacitance, the preset current-limiting resistance, the angular frequency, and the imaginary unit in the first preset data.

As a preferred solution, before the obtaining a first measured dielectric loss value, first current-limiting resistance, and first insulation resistance of a submarine cable, the method further includes:

determining whether there is a branch in the submarine cable; and when there is the branch, obtaining the first measured dielectric loss value, the first current-limiting resistance, and the first insulation resistance of the submarine cable; or when there is no branch, obtaining a second measured dielectric loss value, second current-limiting resistance, and second cable resistance of the submarine cable;

substituting the second measured dielectric loss value, the second current-limiting resistance, and the second cable resistance into an expression of the second measured dielectric loss value to calculate a second actual dielectric loss value, where the expression of the second measured dielectric loss value is calculated based on a preset second frequency domain admittance expression; and evaluating the insulation performance of the submarine cable based on the second actual dielectric loss value to obtain an insulation performance evaluation result.

Based on the original solution, this preferred solution provides another method for solving a measured dielectric loss value when there is no branch in the submarine cable. The second actual dielectric loss value is obtained by substituting the obtained second measured dielectric loss value, second current-limiting resistance, and second cable resistance of the submarine cable into the pre-calculated expression of the second measured dielectric loss value, and then the insulation performance of the submarine cable is evaluated based on the second actual dielectric loss value to obtain the evaluation result. This evaluation method is simple, fast, efficient, and convenient.

As a preferred solution, the expression of the second measured dielectric loss value is calculated based on a preset second frequency domain admittance expression is specifically as follows:

establishing an expression related to a frequency domain and impedance based on second preset data, and performing formula transformation on the expression related to the frequency domain and the impedance to obtain an initial frequency domain admittance expression, where the second preset data includes a preset second measured dielectric loss value, preset cable resistance, preset cable capacitance, preset current-limiting resistance, an angular frequency under a direct current, and an imaginary unit that are of the submarine cable;

transforming the initial frequency domain admittance expression into a functional expression including a portion without the imaginary unit and another portion with the imaginary unit, to obtain the second frequency domain admittance expression containing a second real part and a second imaginary part; and calculating the expression of the second measured dielectric loss value based on the second real part and the second imaginary part.

As a preferred solution, the expression of the second measured dielectric loss value is specifically as follows:

$$\tan\delta_{system} = \tan\delta' + \frac{R}{R_0 \tan\delta'}$$

where tan $\delta_{system}$, R, and $R_0$ respectively represent the preset second measured dielectric loss value, the preset current-limiting resistance, and the preset cable resistance in the second preset data, and tan δ' represents the to-be-solved second actual dielectric loss value.

The present disclosure further provides an apparatus for evaluating insulation performance of a submarine cable, including an information obtaining module, a data solving module, and a first evaluation module, where the information obtaining module is configured to obtain a first measured dielectric loss value, first current-limiting resistance, and first insulation resistance of a submarine cable;

the data solving module is configured to substitute the first measured dielectric loss value, the first current-limiting resistance, and the first insulation resistance into an expression of the first measured dielectric loss value to calculate a first actual dielectric loss value, where the expression of the first measured dielectric loss value is calculated based on a preset expression of a total dielectric loss value, the expression of the total dielectric loss value includes a first product and the to-be-solved first actual dielectric loss value, the first product is calculated by a preset model in an $n^{th}$-order situation, the $n^{th}$-order situation represents that there are n branches in the submarine cable, and the n is a natural number; and the first evaluation module is configured to evaluate insulation performance of the submarine cable based on the first actual dielectric loss value to obtain an insulation performance evaluation result.

As a preferred solution, the data solving module further includes a first transformation unit, a second transformation unit, and a third transformation unit, where the first transformation unit is configured to establish an expression related to a frequency domain and impedance based on first preset data, and perform formula transformation on the expression related to the frequency domain and the impedance to obtain an initial frequency domain admittance expression, where the first preset data includes a preset first measured dielectric loss value, preset total cable resistance, preset total cable capacitance, preset current-limiting resistance, an imaginary unit, an angular frequency under a direct current, and preset insulation resistance that are of the submarine cable;

the second transformation unit is configured to transform the initial frequency domain admittance expression into a complex number algebraic form to obtain a first frequency domain admittance expression containing a first real part and a first imaginary part; and the third transformation unit is configured to calculate the expression of the total dielectric loss value based on the first real part and the first imaginary part, and substitute a value of the first product into the expression of the total dielectric loss value to calculate the expression of the first measured dielectric loss value; where the first product is a product of the first real part and the preset current-limiting resistance.

As a preferred solution, the data solving module further includes a first product unit; and the first product unit is configured to calculate the first product in the $n^{th}$-order situation by a Debye model, where the first product is as follows:

$$AR = \frac{R}{R_0} + \sum_{1}^{n} \frac{\omega^2 C_i^2 R_i R}{1 + \omega^2 C_i^2 R_i^2} = \frac{R}{R_0} + \sum_{1}^{n} \frac{\omega^2 C_i^2 R_i R}{1 + \omega^2 C_i^2 R_i^2} \cdot \frac{R_i}{R_i} \approx \frac{R}{R_{DC}}$$

where A represents the first real part, $R_0$, R, ω, and $R_{DC}$ respectively represent the preset total cable resistance, the preset current-limiting resistance, the angular frequency, and the preset insulation resistance in the first preset data, and $C_i$ and $R_i$ respectively represent equivalent capacitance and equivalent resistance of an $i^{th}$ branch in the submarine cable.

As a preferred solution, the expression of the total dielectric loss value is specifically as follows:

$$\tan\delta_{total} = (AR + 1)\tan\delta + \frac{AR}{\tan\delta}$$

where tan $\delta_{total}$ represents the preset first measured dielectric loss value, AR represents the first product, and tan δ represents the to-be-solved first actual dielectric loss value.

As a preferred solution, the initial frequency domain admittance expression is specifically as follows:

$$G(\omega) = \frac{R_0 + R + \omega^2 C_0^2 R_0^2 R + j\omega C_0 R_0^2}{(R_0 + R)^2 + \omega^2 C_0^2 R_0^2 R^2}$$

where $R_0$, $C_0$, R, ω, and j respectively represent the preset total cable resistance, the preset total cable capacitance, the preset current-limiting resistance, the angular frequency, and the imaginary unit in the first preset data.

As a preferred solution, the apparatus for evaluating insulation performance of a submarine cable further includes a determining module, a data obtaining module, and a second evaluation module, where the determining module is configured to determine whether there is a branch in the submarine cable;

the data obtaining module is configured to: when there is the branch, obtain the first measured dielectric loss value, the first current-limiting resistance, and the first insulation resistance of the submarine cable;

the second evaluation module is configured to: when there is no branch, obtain a second measured dielectric loss value, second current-limiting resistance, and second cable resistance of the submarine cable;

the second evaluation module is further configured to substitute the second measured dielectric loss value, the second current-limiting resistance, and the second cable resistance into an expression of the second measured dielectric loss value to calculate a second actual dielectric loss value, where the expression of the second measured dielectric loss value is calculated based on a preset second frequency domain admittance expression; and the second evaluation module is further configured to evaluate the insulation performance of the submarine cable based on the second actual dielectric loss value to obtain an insulation performance evaluation result.

As a preferred solution, the second evaluation module further includes a fourth transformation unit, a fifth transformation unit, and a sixth transformation unit, where the fourth transformation unit is configured to establish an expression related to a frequency domain and impedance based on second preset data, and perform formula transformation on the expression related to the frequency domain and the impedance to obtain an initial frequency domain admittance expression, where the second preset data includes a preset second measured dielectric loss value, preset cable resistance, preset cable capacitance, preset current-limiting resistance, an angular frequency under a direct current, and an imaginary unit that are of the submarine cable;

the fifth transformation unit is configured to transform the initial frequency domain admittance expression into a functional expression including a portion without the imaginary unit and another portion with the imaginary unit, to obtain the second frequency domain admittance expression containing a second real part and a second imaginary part; and the sixth transformation unit is configured to calculate the expression of the second measured dielectric loss value based on the second real part and the second imaginary part.

As a preferred solution, the expression of the second measured dielectric loss value is specifically as follows:

$$\tan\delta_{system} = \tan\delta' + \frac{R}{R_0 \tan\delta'}$$

where $\tan\delta_{system}$, R, and $R_0$ respectively represent the preset second measured dielectric loss value, the preset current-limiting resistance, and the preset cable resistance in the second preset data, and $\tan\delta'$ represents the to-be-solved second actual dielectric loss value.

The present disclosure further provides a storage medium, storing a computer program, where the computer program is invoked and executed by a computer to implement the above method for evaluating insulation performance of a submarine cable.

DETAILED DESCRIPTION OF THE EMBODIMENTS

The technical solutions in the embodiments of the present disclosure are clearly and completely described below with reference to the accompanying drawings in the embodiments of the present disclosure. Apparently, the described embodiments are only some rather than all of the embodiments of the present disclosure. All other embodiments obtained by a person of ordinary skill in the art based on the embodiments of the present disclosure without creative efforts shall fall within the protection scope of the present disclosure.

In the description of the present disclosure, it should be understood that terms "first", "second", "third", "fourth", "fifth", and "sixth" are used merely for a descriptive purpose, and should not be construed as indicating or implying a relative importance, or implicitly indicating a quantity of indicated technical features. Therefore, features defined by the terms "first", "second", "third", "fourth", "fifth", and "sixth" may explicitly or implicitly include one or more of the features.

Figure 1:
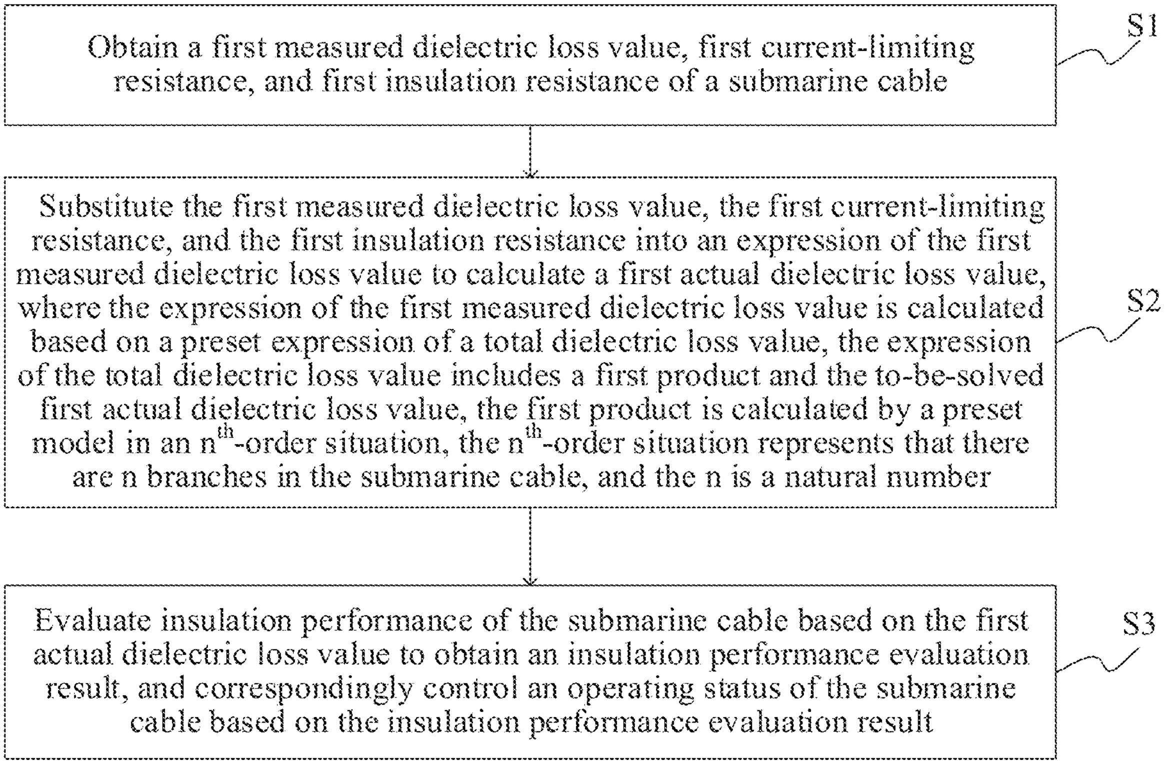
FIG. 1 is a schematic flowchart of a method for evaluating insulation performance of a submarine cable according to an embodiment of the present disclosure.

Referring to FIG. 1, an embodiment of the present disclosure provides a method for evaluating insulation performance of a submarine cable, including the following steps S1 to S3.

S1: Obtain a first measured dielectric loss value, first current-limiting resistance, and first insulation resistance of a submarine cable.

In this embodiment of the present disclosure, a PDC method is used to apply a voltage that is approximately a step signal to the submarine cable to conduct a test to obtain the first measured dielectric loss value. A value of the first current-limiting resistance can be calculated based on the Ohm's law. The submarine cable can be detected by an insulation resistance tester ZZJ3D of a direct-current resistor or a high resistance meter, to obtain the first insulation resistance.

S2: Substitute the first measured dielectric loss value, the first current-limiting resistance, and the first insulation resistance into an expression of the first measured dielectric loss value to calculate a first actual dielectric loss value, where the expression of the first measured dielectric loss value is calculated based on a preset expression of a total dielectric loss value, the expression of the total dielectric loss value includes a first product and the to-be-solved first actual dielectric loss value, the first product is calculated by a preset model in an $n^{th}$-order situation, the $n^{th}$-order situation represents that there are n branches in the submarine cable, and the n is a natural number.

In this embodiment of the present disclosure, the step S2 includes sub-steps S2.1 to S2.5.

S2.1: Establish an expression related to a frequency domain and impedance based on first preset data, and perform formula transformation on the expression related to the frequency domain and the impedance to obtain an initial frequency domain admittance expression, where the first preset data includes a preset first measured dielectric loss value $\tan\delta_{total}$, preset total cable resistance $R_0$, preset total cable capacitance $C_0$, preset current-limiting resistance R, an imaginary unit j, an angular frequency w under a direct current, and preset insulation resistance $R_{DC}$ that are of the submarine cable.

The expression related to the frequency domain and the impedance is as follows:

$$Z(\omega) = \frac{1}{\frac{1}{R_0} + j\omega C_0} + R$$

The initial frequency domain admittance expression is as follows:

$$G(\omega) = \frac{1}{Z(\omega)} = \frac{R_0 + R + \omega^2 C_0^2 R_0^2 R + j\omega C_0 R_0^2}{(R_0 + R)^2 + \omega^2 C_0^2 R_0^2 R^2}$$

In this embodiment, a reason for establishing the expression related to the frequency domain and the impedance based on the first preset data is that many parameters are eliminated after the expression related to the frequency domain and the impedance is transformed into the initial frequency domain admittance expression and further transformation processing is performed on the initial frequency domain direct-current resistor. Therefore, establishing the expression related to the frequency domain and the impedance based on the first preset data can save manpower resources required to obtain data.

S2.2: Transform the initial frequency domain admittance expression into a complex number algebraic form (A+Bi) to obtain a first frequency domain admittance expression containing a first real part A and a first imaginary part B.

The first frequency domain admittance expression is as follows:

$$Y = \frac{A + iB}{1 + AR + iBR} = \frac{A + R(A^2 + B^2) + iB}{(1 + AR)^2 + B^2 R^2}$$

In the above expression, A, B, and i respectively represent the first real part, the first imaginary part, and an imaginary unit.

In this embodiment, if a circuit of the submarine cable has a first-order response or a multi-order response, that is, there is no branch or there are many branches, the frequency domain and impedance of the circuit can be transformed, and the initial frequency domain admittance expression can be transformed into the general A+Bi form to solve an equation. This method can ensure that the submarine cable to which this solution is applicable has a wider branch range.

S2.3: Divide the first real part A by the first imaginary part B to obtain the expression of the total dielectric loss value.

The expression of the total dielectric loss value is as follows:

$$\tan\delta_{total} = (AR + 1)\tan\delta + \frac{AR}{\tan\delta}$$

S2.4: Calculate a first product of the first real part A and the preset current-limiting resistance R in the $n^{th}$-order situation by the Debye model, where the $n^{th}$-order situation represents that there are the n branches in the submarine cable, and the n is the natural number.

In a $0^{th}$-order situation, $$A = \frac{1}{R_0}.$$

In a first-order situation, $$A = \frac{1}{R_0} + \frac{\omega^2 C_1^2 R_1}{1 + \omega^2 C_1^2 R_1^2}.$$

In the $n^{th}$-order situation, $$A = \frac{1}{R_0} + \sum\nolimits_1^n \frac{\omega^2 C_i^2 R_i}{1 + \omega^2 C_i^2 R_i^2}.$$

$$\begin{aligned} AR &= \frac{R}{R_0} + \sum_1^n \frac{\omega^2 C_i^2 R_i R}{1 + \omega^2 C_i^2 R_i^2} \\ &= \frac{R}{R_0} + \sum_1^n \frac{\omega^2 C_i^2 R_i R}{1 + \omega^2 C_i^2 R_i^2} \cdot \frac{R_i}{R_i} \\ &= \frac{R}{R_0} + \sum_1^n \left(1 - \frac{1}{1 + \omega^2 C_i^2 R_i^2}\right) \cdot \frac{R}{R_i} \\ &\approx \frac{R}{R_0} + \sum_1^n \frac{R}{R_i} = \frac{R}{R_{DC}} \end{aligned}$$

A represents the first real part, $R_0$, R, ω, and $R_{DC}$ respectively represent the preset total cable resistance, the preset current-limiting resistance, the angular frequency, and the preset insulation resistance in the first preset data, and $C_i$ and $R_i$ respectively represent equivalent capacitance and equivalent resistance of an $i^{th}$ branch in the submarine cable.

This embodiment uses the Debye model to calculate the first product of the first real part and the preset current-limiting resistance in the $n^{th}$-order situation. In this case, the Debye model is equivalent to an equivalent model of the submarine cable, which can be used to cover all possible branch situations of the submarine cable, and can quickly and accurately calculate the first product of the first real part and the preset current-limiting resistance in different branch situations.

S2.5: Substitute a value of the first product (AR) into the expression of the total dielectric loss value to obtain the expression of the first measured dielectric loss value.

The expression of the first measured dielectric loss value is as follows:

$$\tan\delta_{total} = \left(\frac{R}{R_{DC}} + 1\right)\tan\delta + \frac{R}{R_{DC}\tan\delta}$$

S2.6: Substitute the first measured dielectric loss value, the first current-limiting resistance, and the first insulation resistance into the expression of the first measured dielectric loss value to calculate the first actual dielectric loss value tan δ. Specifically, substitute the first measured dielectric loss value into the preset first measured dielectric loss value tan $\delta_{total}$, substitute the first current-limiting resistance into the preset current-limiting resistance R, and substitute the first insulation resistance into the preset insulation resistance $R_{DC}$, to calculate the first actual dielectric loss value tan δ.

Figure 2:
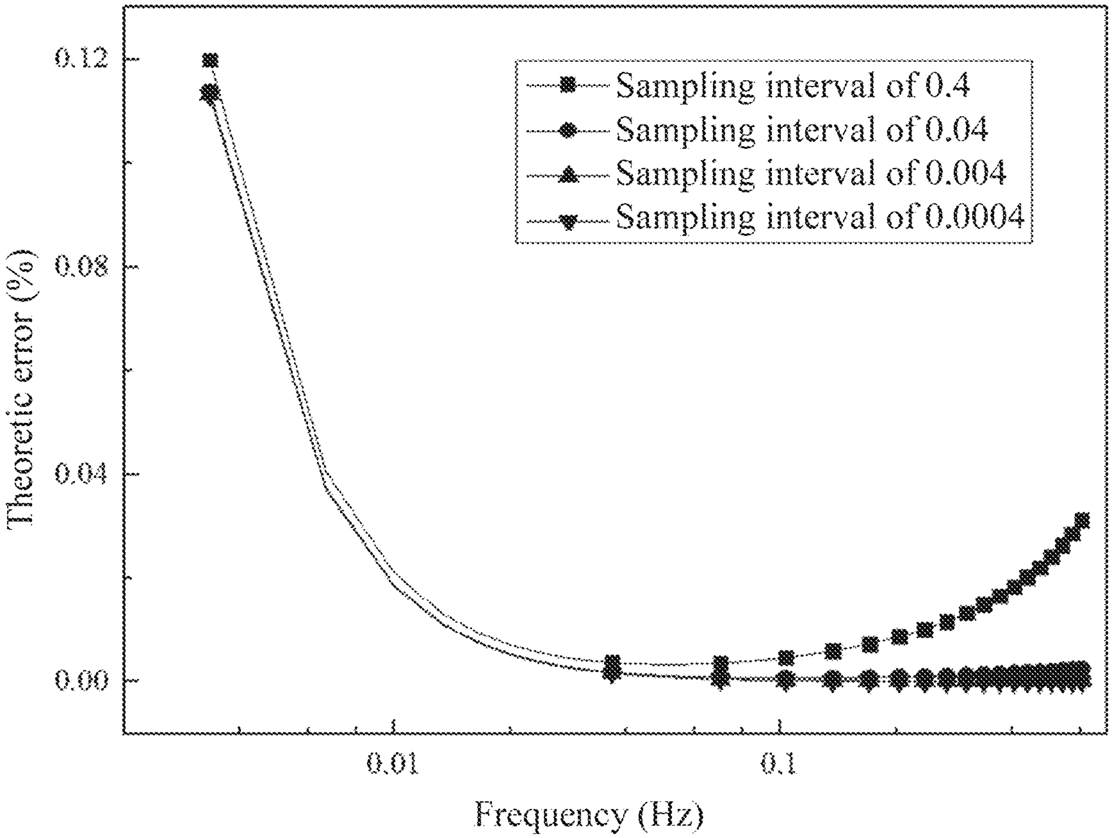
FIG. 2 shows calculation errors of a low-frequency dielectric loss at different sampling intervals according to an embodiment of the present disclosure.

Referring to FIG. 2, in order to apply the embodiments of the present disclosure, the embodiments of the present disclosure further provide a calculation error diagram of a low-frequency dielectric loss at different sampling intervals. In FIG. 2, a horizontal axis represents a frequency of a current flowing through the submarine cable, and a vertical axis represents a theoretical error of the first actual dielectric loss value tan δ. For the first actual dielectric loss value tan δ, it can be seen that after a sampling interval is less than 0.04, accuracy of the algorithm near 0.1 Hz in a low frequency band is relatively high, with an average error of less than 0.0002%. It can be considered that this result can be well fitted. Therefore, it can be obtained through analysis that for a long submarine cable with large capacitance, it is reasonable to take a sampling interval of 0.04 seconds in a process of conducting a PDC test to obtain a measured dielectric loss value, such that the first actual dielectric loss value tan δ can be accurately obtained.

S3: Evaluate insulation performance of the submarine cable based on the first actual dielectric loss value to obtain an insulation performance evaluation result, and correspondingly control an operating status of the submarine cable based on the insulation performance evaluation result.

Specifically, the insulation performance evaluation result includes insulation aging, damping and water ingress, and other insulation statuses. The operating status of the submarine cable is correspondingly controlled based on the insulation performance evaluation result to avoid burning-out or breakdown of the submarine cable due to poor insulation. When the insulation performance evaluation result is the insulation aging, the damping and water ingress, or the other insulation statuses, the operating status of the submarine cable is correspondingly switched to an operating stopped state.

In this embodiment of the present disclosure, the insulation performance of the submarine cable is evaluated based on the first actual dielectric loss value tan & to obtain the insulation performance evaluation result. A smaller first actual dielectric loss value tan & leads to better insulation performance of the submarine cable.

In this embodiment of the present disclosure, the step S3 further includes a step S10.

S10: Determine whether there is a branch in the submarine cable.

Case 1: When there is the branch, the steps S1 to S3 are performed.

Case 2: When there is no branch, a second measured dielectric loss value, second current-limiting resistance, and second cable resistance of the submarine cable are obtained, and the following sub-steps (S10.1 to S10.5) are performed.

S10.1: Establish an expression related to a frequency domain and impedance based on second preset data, and perform formula transformation on the expression related to the frequency domain and the impedance to obtain an initial frequency domain admittance expression, where the second preset data includes a preset second measured dielectric loss value tan $\delta_{system}$, preset cable resistance $R_0$, preset cable capacitance $C_0$, preset current-limiting resistance R, an angular frequency ω under a direct current, and an imaginary unit j that are of the submarine cable.

The expression related to the frequency domain and the impedance is as follows:

$$Z(\omega) = \frac{1}{\frac{1}{R_0} + j\omega C_0} + R$$

The initial frequency domain admittance expression is as follows:

$$G(\omega) = \frac{1}{Z(\omega)} = \frac{R_0 + R + \omega^2 C_0^2 R_0^2 R + j\omega C_0 R_0^2}{(R_0 + R)^2 + \omega^2 C_0^2 R_0^2 R^2}$$

Figure 3:
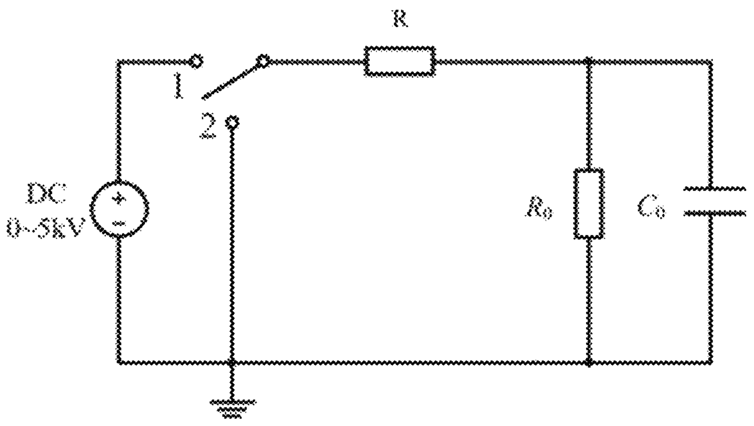
FIG. 3 shows a first-order circuit model of a PDC according to an embodiment of the present disclosure.

Referring to FIG. 3, in order to apply the embodiments of the present disclosure, the embodiments of the present disclosure further provide a diagram of a first-order circuit model of a PDC. When there is no branch, an equivalent model of the circuit of the submarine cable can be represented by a first-order Resistor-Capacitance (RC) parallel model, where $R_0$ and $C_0$ respectively represent the preset cable resistance and the preset cable capacitance, and R represents the preset current-limiting resistance.

S10.2: First transform the initial frequency domain admittance expression into a functional expression including a portion without the imaginary unit and another portion with the imaginary unit, to obtain a second frequency domain admittance expression containing a second real part and a second imaginary part.

Then the second real part is divided by the second imaginary part to obtain an expression of a third measured dielectric loss value.

The expression of the third measured dielectric loss value is as follows:

$$\tan\delta_3 = \frac{1}{\omega C_0 R_0} + \frac{R}{\omega C_0 R_0^2} + \omega C_0 R$$

S10.3: Use tan δ' to represent $$\frac{1}{\omega C_0 R_0}$$

in the expression of the third measured dielectric loss value to obtain an expression of a fourth measured dielectric loss value, and ignore a second term in the expression of the fourth measured dielectric loss value to obtain an expression of a second actual dielectric loss value.

The expression of the fourth measured dielectric loss value is as follows:

$$\tan\delta_4 = \tan\delta' + \frac{R}{R_0}\tan\delta' + \frac{R}{R_0} \cdot \frac{1}{\tan\delta'}$$

The expression of the second measured dielectric loss value is as follows:

$$\tan\delta_{system} = \tan\delta' + \frac{R}{R_0 \tan\delta'}$$

It should be noted that the tan δ' is used to represent the $$\frac{1}{\omega C_0 R_0}$$

in the expression of the third measured dielectric loss value because the second actual dielectric loss value is obtained through the formula $$\frac{1}{\omega C_0 R_0}.$$

However, since it is difficult to obtain parameters in the formula $$\frac{1}{\omega C_0 R_0},$$

the parameter tan δ' is used to represent the formula $$\frac{1}{\omega C_0 R_0}.$$

Then a value of the parameter tan δ' is obtained through inverse solving according to the method described in this embodiment, so as to obtain the second actual dielectric loss value. The second term in the expression of the fourth measured dielectric loss value is ignored because $R/R_0$ depends on a ratio of current-limiting resistance to cable resistance in the circuit. Even if a length of the submarine cable reaches 7500 m or more, cable resistance of the submarine cable should be significantly greater than the current-limiting resistance. Therefore, in reality, a coefficient of the second term does not affect a final result.

S10.4: Substitute the second measured dielectric loss value, the second current-limiting resistance, and the second cable resistance into the expression of the second measured dielectric loss value to calculate the second actual dielectric loss value. Specifically, substitute the second measured dielectric loss value into the preset second measured dielectric loss value tan $\delta_{system}$, substitute the second current-limiting resistance into the preset current-limiting resistance R, and substitute the second cable resistance into the preset cable resistance $R_0$, to calculate the second actual dielectric loss value tan δ'.

Figure 4:
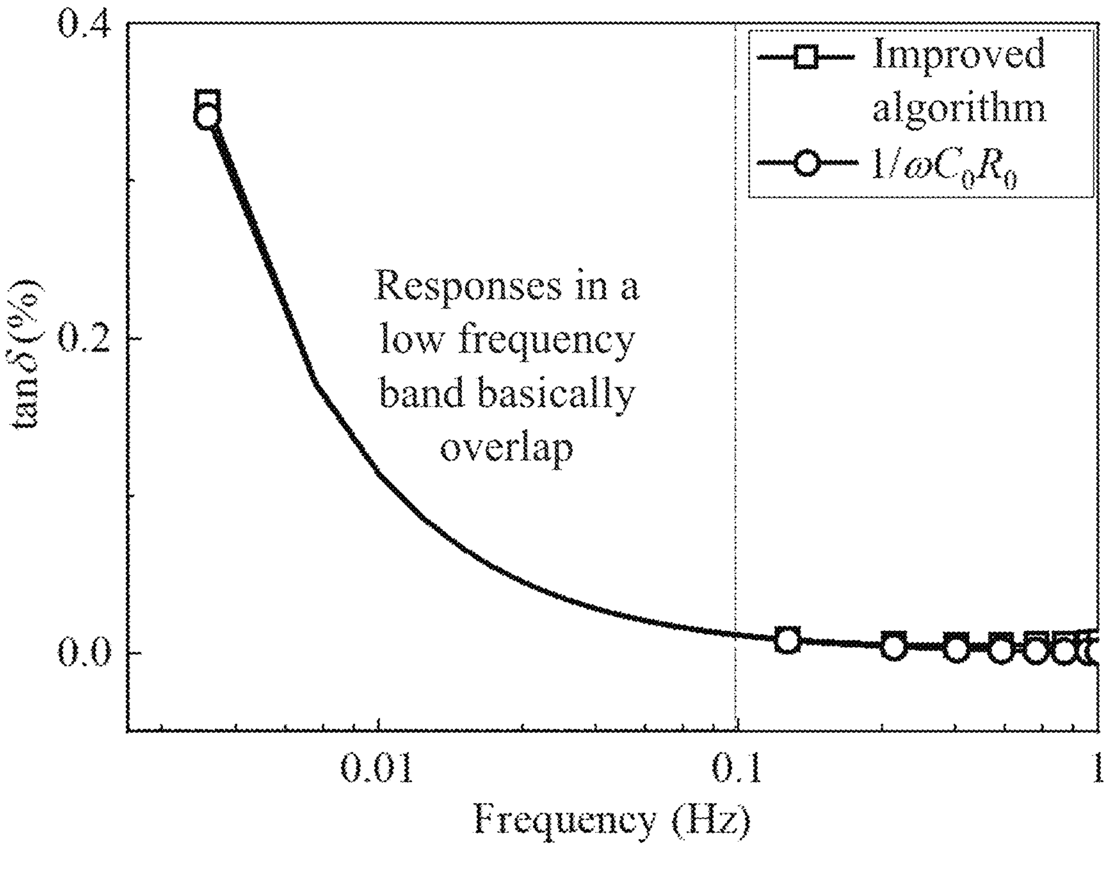
FIG. 4 is a comparison diagram of correction of a dielectric loss calculation result according to an embodiment of the present disclosure.

Referring to FIG. 4, in order to apply the embodiments of the present disclosure, the embodiments of the present disclosure further provide a comparison diagram of correction of a dielectric loss calculation result. The cable resistance $R_0$ can be calculated based on conductivity. When the cable resistance $R_0$ is 15.55 GΩ and the current-limiting resistance R is 5 MΩ, the above parameters are substituted into the expression of the second measured dielectric loss value. Then, different first measured dielectric loss values tan $\delta_{system}$ are selected to draw a comparison diagram of the second actual dielectric loss value (improved algorithm) obtained through this embodiment and the actual dielectric loss value $$\left(\frac{1}{\omega C_0 R_0}\right).$$

In FIG. 4, a horizontal axis represents the frequency of the current flowing through the submarine cable, and a vertical axis represents the first measured dielectric loss value tan $\delta_{system}$. It can be seen that a response fitting effect of the low frequency band is good, and an improvement effect is basically consistent with an actual effect. It can be considered that a calculated value at this time is the actual dielectric loss value. Therefore, the second measured dielectric loss value obtained through this embodiment is reliable.

S10.5: Evaluate the insulation performance of the submarine cable based on the second actual dielectric loss value tan δ' to obtain the insulation performance evaluation result. A smaller second actual dielectric loss value tan δ' leads to better insulation performance of the submarine cable.

Based on the original solution, this embodiment provides another method for solving the actual dielectric loss value when there is no branch in the submarine cable. The second actual dielectric loss value is obtained by substituting the obtained second measured dielectric loss value, second current-limiting resistance, and second cable resistance of the submarine cable into the pre-calculated expression of the second measured dielectric loss value, and then the insulation performance of the submarine cable is evaluated based on the second actual dielectric loss value to obtain the evaluation result. This evaluation method is simple, fast, efficient, and convenient.

In this embodiment, it is considered that the circuit of the submarine cable has the first-order response and has no multi-order response, that is, there is no branch. Therefore, there is no need to transform the frequency domain and impedance of the circuit, that is, there is no need to transform the initial frequency domain admittance expression into the general A+Bi form to solve the equation. Instead, the initial frequency domain admittance expression is directly transformed into the functional expression containing the second real part and the second imaginary part, and the equation is solved using the second real part and the second imaginary part. This makes it more convenient to obtain the expression of the second measured dielectric loss value.

Generally, this embodiment of the present disclosure has the following beneficial effects:

The present disclosure obtains the first actual dielectric loss value by substituting the obtained first measured dielectric loss value, first current-limiting resistance, and first insulation resistance into the pre-calculated expression of the first measured dielectric loss value, and then evaluates the insulation performance of the submarine cable based on the first actual dielectric loss value to obtain the evaluation result. This evaluation method is simple, fast, efficient, and convenient. The expression of the total dielectric loss value includes the first product and the to-be-solved first actual dielectric loss value. The first product is calculated by the preset model and is substituted into the expression of the total dielectric loss value to obtain the expression of the first measured dielectric loss value. At this time, the expression of the first measured dielectric loss value contains the to-be-solved first actual dielectric loss value. The expression of the first measured dielectric loss value is actually a combination of the first actual dielectric loss value and "a parameter that causes a too large measured dielectric loss value". Therefore, the first actual dielectric loss value can be obtained through inverse solving, provided that the related data is substituted into the expression of the first measured dielectric loss value. This solving method is simple and fast, and ensures accuracy of the first actual dielectric loss value after too large data is removed. In this way, the result of evaluating the insulation performance of the submarine cable based on the first actual dielectric loss value is highly accurate.

In addition, based on the original solution, this embodiment provides the another method for solving the actual dielectric loss value when there is no branch in the submarine cable. The second actual dielectric loss value is obtained by substituting the obtained second measured dielectric loss value, second current-limiting resistance, and second cable resistance of the submarine cable into the pre-calculated expression of the second measured dielectric loss value, and then the insulation performance of the submarine cable is evaluated based on the second actual dielectric loss value to obtain the evaluation result. This evaluation method is efficient and convenient.

Figure 5:
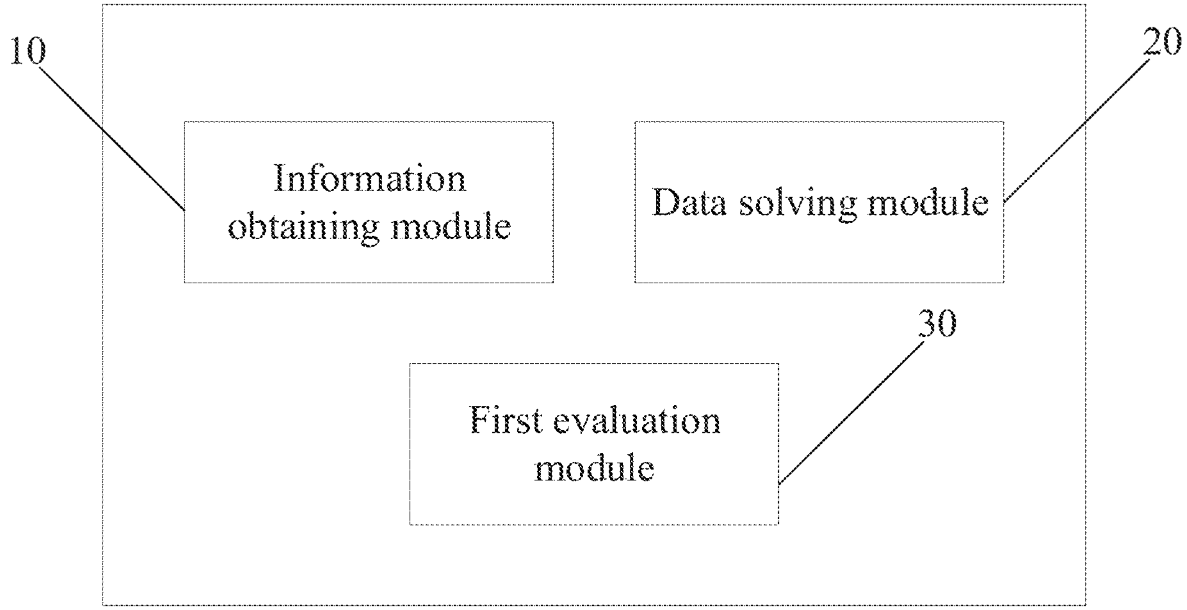
FIG. 5 is a schematic structural diagram of an apparatus for evaluating insulation performance of a submarine cable according to an embodiment of the present disclosure.

Referring to FIG. 5, an embodiment of the present disclosure provides an apparatus for evaluating insulation performance of a submarine cable, including an information obtaining module 10, a data solving module 20, and a first evaluation module 30.

The information obtaining module 10 is configured to obtain a first measured dielectric loss value, first current-limiting resistance, and first insulation resistance of a submarine cable.

The data solving module 20 is configured to substitute the first measured dielectric loss value, the first current-limiting resistance, and the first insulation resistance into an expression of the first measured dielectric loss value to calculate a first actual dielectric loss value. The expression of the first measured dielectric loss value is calculated based on a preset expression of a total dielectric loss value, and the expression of the total dielectric loss value includes a first product and the to-be-solved first actual dielectric loss value. The first product is calculated by a preset model in an $n^{th}$-order situation, the $n^{th}$-order situation represents that there are n branches in the submarine cable, and the n is a natural number.

The first evaluation module 30 is configured to evaluate insulation performance of the submarine cable based on the first actual dielectric loss value to obtain an insulation performance evaluation result.

In an embodiment, the data solving module further includes a first transformation unit, a second transformation unit, and a third transformation unit.

The first transformation unit is configured to establish an expression related to a frequency domain and impedance based on first preset data, and perform formula transformation on the expression related to the frequency domain and the impedance to obtain an initial frequency domain admittance expression. The first preset data includes a preset first measured dielectric loss value, preset total cable resistance, preset total cable capacitance, preset current-limiting resistance, an imaginary unit, an angular frequency under a direct current, and preset insulation resistance that are of the submarine cable.

The second transformation unit is configured to transform the initial frequency domain admittance expression into a complex number algebraic form to obtain a first frequency domain admittance expression containing a first real part and a first imaginary part.

The third transformation unit is configured to calculate the expression of the total dielectric loss value based on the first real part and the first imaginary part, and substitute a value of the first product into the expression of the total dielectric loss value to calculate the expression of the first measured dielectric loss value.

The first product is a product of the first real part and the preset current-limiting resistance.

In an embodiment, the data solving module further includes a first product unit.

The first product unit is configured to calculate the first product in the $n^{th}$-order situation by a Debye model.

The first product is as follows:

$$AR = \frac{R}{R_0} + \sum_{1}^{n} \frac{\omega^2 C_i^2 R_i R}{1 + \omega^2 C_i^2 R_i^2} = \frac{R}{R_0} + \sum_{1}^{n} \frac{\omega^2 C_i^2 R_i R}{1 + \omega^2 C_i^2 R_i^2} \cdot \frac{R_i}{R_i} \approx \frac{R}{R_{DC}}$$

As described above, A represents the first real part, $R_0$, R, ω, and $R_{DC}$ respectively represent the preset total cable resistance, the preset current-limiting resistance, the angular frequency, and the preset insulation resistance in the first preset data, and $C_i$ and $R_i$ respectively represent equivalent capacitance and equivalent resistance of an $i^{th}$ branch in the submarine cable.

In an embodiment, the expression of the total dielectric loss value is specifically as follows:

$$\tan\delta_{total} = (AR + 1)\tan\delta + \frac{AR}{\tan\delta}$$

In the above expression, tan $\delta_{total}$ represents the preset first measured dielectric loss value, AR represents the first product, and tan δ represents the to-be-solved first actual dielectric loss value.

In an embodiment, the initial frequency domain admittance expression is specifically as follows:

$$G(\omega) = \frac{R_0 + R + \omega^2 C_0^2 R_0^2 R + j\omega C_0 R_0^2}{(R_0 + R)^2 + \omega^2 C_0^2 R_0^2 R^2}$$

In the above expression, $R_0$, $C_0$, R, ω, and j respectively represent the preset total cable resistance, the preset total cable capacitance, the preset current-limiting resistance, the angular frequency, and the imaginary unit in the first preset data.

In an embodiment, the apparatus for evaluating insulation performance of a submarine cable further includes a determining module, a data obtaining module, and a second evaluation module.

The determining module is configured to determine whether there is a branch in the submarine cable.

The data obtaining module is configured to: when there is the branch, obtain the first measured dielectric loss value, the first current-limiting resistance, and the first insulation resistance of the submarine cable.

The second evaluation module is configured to: when there is no branch, obtain a second measured dielectric loss value, second current-limiting resistance, and second cable resistance of the submarine cable.

The second evaluation module is further configured to substitute the second measured dielectric loss value, the second current-limiting resistance, and the second cable resistance into an expression of the second measured dielectric loss value to calculate a second actual dielectric loss value. The expression of the second measured dielectric loss value is calculated based on a preset second frequency domain admittance expression.

The second evaluation module is further configured to evaluate the insulation performance of the submarine cable based on the second actual dielectric loss value to obtain an insulation performance evaluation result.

In an embodiment, the second evaluation module further includes a fourth transformation unit, a fifth transformation unit, and a sixth transformation unit.

The fourth transformation unit is configured to establish an expression related to a frequency domain and impedance based on second preset data, and perform formula transformation on the expression related to the frequency domain and the impedance to obtain an initial frequency domain admittance expression. The second preset data includes a preset second measured dielectric loss value, preset cable resistance, preset cable capacitance, preset current-limiting resistance, an angular frequency under a direct current, and an imaginary unit that are of the submarine cable.

The fifth transformation unit is configured to transform the initial frequency domain admittance expression into a functional expression including a portion without the imaginary unit and another portion with the imaginary unit, to obtain the second frequency domain admittance expression containing a second real part and a second imaginary part.

The sixth transformation unit is configured to calculate the expression of the second measured dielectric loss value based on the second real part and the second imaginary part.

In an embodiment, the expression of the second measured dielectric loss value is specifically as follows:

$$\tan\delta_{system} = \tan\delta' + \frac{R}{R_0 \tan\delta'}$$

In the above expression, tan $\delta_{system}$, R, and $R_0$ respectively represent the preset second measured dielectric loss value, the preset current-limiting resistance, and the preset cable resistance in the second preset data, and tan δ' represents the to-be-solved second actual dielectric loss value.

In another implementation example, the apparatus for evaluating insulation performance of a submarine cable includes a processor for executing the program modules and units stored in a memory, including the information obtaining module 10, the data solving module 20, the first evaluation module 30, the determining module, the data obtaining module, the second evaluation module, the first transformation unit, the second transformation unit, the third transformation unit, the fourth transformation unit, the fifth transformation unit, and the sixth transformation unit.

The apparatus has the following beneficial effects:

The apparatus obtains the first actual dielectric loss value by substituting the obtained first measured dielectric loss value, first current-limiting resistance, and first insulation resistance into the pre-calculated expression of the first measured dielectric loss value, and then evaluates the insulation performance of the submarine cable based on the first actual dielectric loss value to obtain the evaluation result. This evaluation method is simple, fast, efficient, and convenient. The expression of the total dielectric loss value includes the first product and the to-be-solved first actual dielectric loss value. The first product is calculated by the preset model and is substituted into the expression of the total dielectric loss value to obtain the expression of the first measured dielectric loss value. At this time, the expression of the first measured dielectric loss value contains the to-be-solved first actual dielectric loss value. The expression of the first measured dielectric loss value is actually a combination of the first actual dielectric loss value and "a parameter that causes a too large measured dielectric loss value". Therefore, the first actual dielectric loss value can be obtained through inverse solving, provided that the related data is substituted into the expression of the first measured dielectric loss value. This solving method is simple and fast, and ensures accuracy of the first actual dielectric loss value after too large data is removed. In this way, the result of evaluating the insulation performance of the submarine cable based on the first actual dielectric loss value is highly accurate.

Correspondingly, the embodiments of the present disclosure further provide a computer-readable storage medium. The computer-readable storage medium includes a computer program, and the computer program is run to control a device in which the computer-readable storage medium is located to execute the method for evaluating insulation performance of a submarine cable.

If implemented in a form of a software functional unit and sold or used as a standalone product, the method for evaluating insulation performance of a submarine cable may be stored in a computer-readable storage medium. Based on such an understanding, all or some of processes for implementing the method in the foregoing embodiments can be completed by a computer program instructing relevant hardware. The computer program may be stored in a computer-readable storage medium. The computer program is executed by a processor to perform the steps of the foregoing method embodiments. The computer program includes computer program code, and the computer program code may be in a form of source code, object code, or an executable file, may be in some intermediate forms, or the like. The computer-readable medium may include: any physical entity or apparatus capable of carrying computer program code, a recording medium, a USB disk, a mobile hard disk drive, a magnetic disk, an optical disc, a computer memory, a Read-Only Memory (ROM), a Random Access Memory (RAM), an electrical carrier signal, a telecommunications signal, a software distribution medium, and the like.

The above descriptions are merely preferred implementations of the present disclosure. It should be noted that a person of ordinary skill in the art may further make several improvements and modifications without departing from the principle of the present disclosure, but such improvements and modifications should be deemed as falling within the protection scope of the present disclosure.

The invention claimed is:

1. A method for evaluating insulation performance of a submarine cable, comprising:

obtaining a first measured dielectric loss value, first current-limiting resistance, and first insulation resistance of a submarine cable;

substituting the first measured dielectric loss value, the first current-limiting resistance, and the first insulation resistance into an expression of the first measured dielectric loss value to calculate a first actual dielectric loss value, wherein the expression of the first measured dielectric loss value is calculated based on a preset expression of a total dielectric loss value, the expression of the total dielectric loss value comprises a first product and the to-be-solved first actual dielectric loss value, the first product is calculated by a preset model in an $n^{th}$-order situation, the $n^{th}$-order situation represents that there are n branches in the submarine cable, and the n is a natural number; and evaluating insulation performance of the submarine cable based on the first actual dielectric loss value to obtain an insulation performance evaluation result, and correspondingly controlling an operating status of the submarine cable based on the insulation performance evaluation result.

2. The method for evaluating insulation performance of a submarine cable according to claim 1, wherein the expression of the first measured dielectric loss value is calculated based on a preset expression of a total dielectric loss value is specifically as follows:

establishing an expression related to a frequency domain and impedance based on first preset data, and performing formula transformation on the expression related to the frequency domain and the impedance to obtain an initial frequency domain admittance expression, wherein the first preset data comprises a preset first measured dielectric loss value, preset total cable resistance, preset total cable capacitance, preset current-limiting resistance, an imaginary unit, an angular frequency under a direct current, and preset insulation resistance that are of the submarine cable;

transforming the initial frequency domain admittance expression into a complex number algebraic form to obtain a first frequency domain admittance expression containing a first real part and a first imaginary part; and calculating the expression of the total dielectric loss value based on the first real part and the first imaginary part, and substituting a value of the first product into the expression of the total dielectric loss value to calculate the expression of the first measured dielectric loss value; wherein the first product is a product of the first real part and the preset current-limiting resistance.

3. The method for evaluating insulation performance of a submarine cable according to claim 2, wherein the first product is calculated by a preset model in an $n^{th}$-order situation is specifically as follows:

calculating the first product in the $n^{th}$-order situation by a Debye model, wherein the first product is as follows:

$$AR = \frac{R}{R_0} + \sum_{1}^{n} \frac{\omega^2 C_i^2 R_i R}{1 + \omega^2 C_i^2 R_i^2} = \frac{R}{R_0} + \sum_{1}^{n} \frac{\omega^2 C_i^2 R_i R}{1 + \omega^2 C_i^2 R_i^2} \cdot \frac{R_i}{R_i} \approx \frac{R}{R_{DC}}$$

wherein A represents the first real part, $R_0$, R, ω, and $R_{DC}$ respectively represent the preset total cable resistance, the preset current-limiting resistance, the angular frequency, and the preset insulation resistance in the first preset data, and $C_i$ and $R_i$ respectively represent equivalent capacitance and equivalent resistance of an $i^{th}$ branch in the submarine cable.

4. The method for evaluating insulation performance of a submarine cable according to claim 2, wherein the expression of the total dielectric loss value is specifically as follows:

$$\tan\delta_{total} = (AR + 1)\tan\delta + \frac{AR}{\tan\delta}$$

wherein $\tan\delta_{total}$ represents the preset first measured dielectric loss value, AR represents the first product, and tan δ represents the to-be-solved first actual dielectric loss value.

5. The method for evaluating insulation performance of a submarine cable according to claim 2, wherein the initial frequency domain admittance expression is specifically as follows:

$$G(\omega) = \frac{R_0 + R + \omega^2 C_0^2 R_0^2 R + j\omega C_0 R_0^2}{(R_0 + R)^2 + \omega^2 C_0^2 R_0^2 R^2}$$

wherein $R_0$, $C_0$, R, ω, and j respectively represent the preset total cable resistance, the preset total cable capacitance, the preset current-limiting resistance, the angular frequency, and the imaginary unit in the first preset data.

6. The method for evaluating insulation performance of a submarine cable according to claim 1, before the obtaining a first measured dielectric loss value, first current-limiting resistance, and first insulation resistance of a submarine cable, further comprising:

determining whether there is a branch in the submarine cable; and when there is the branch, obtaining the first measured dielectric loss value, the first current-limiting resistance, and the first insulation resistance of the submarine cable; or when there is no branch, obtaining a second measured dielectric loss value, second current-limiting resistance, and second cable resistance of the submarine cable;

substituting the second measured dielectric loss value, the second current-limiting resistance, and the second cable resistance into an expression of the second measured dielectric loss value to calculate a second actual dielectric loss value, wherein the expression of the second measured dielectric loss value is calculated based on a preset second frequency domain admittance expression; and evaluating the insulation performance of the submarine cable based on the second actual dielectric loss value to obtain an insulation performance evaluation result.

7. The method for evaluating insulation performance of a submarine cable according to claim 6, wherein the expression of the second measured dielectric loss value is calculated based on a preset second frequency domain admittance expression is specifically as follows:

establishing an expression related to a frequency domain and impedance based on second preset data, and performing formula transformation on the expression related to the frequency domain and the impedance to obtain an initial frequency domain admittance expression, wherein the second preset data comprises a preset second measured dielectric loss value, preset cable resistance, preset cable capacitance, preset current-limiting resistance, an angular frequency under a direct current, and an imaginary unit that are of the submarine cable;

transforming the initial frequency domain admittance expression into a functional expression comprising a portion without the imaginary unit and another portion with the imaginary unit, to obtain the second frequency domain admittance expression containing a second real part and a second imaginary part; and calculating the expression of the second measured dielectric loss value based on the second real part and the second imaginary part.

8. The method for evaluating insulation performance of a submarine cable according to claim 7, wherein the expression of the second measured dielectric loss value is specifically as follows:

$$\tan\delta_{system} = \tan\delta' + \frac{R}{R_0 \tan\delta'}$$

wherein $\tan\delta_{system}$, R, and $R_0$ respectively represent the preset second measured dielectric loss value, the preset current-limiting resistance, and the preset cable resistance in the second preset data, and tan δ' represents the to-be-solved second actual dielectric loss value.

9. A storage medium, storing a computer program, wherein the computer program is invoked and executed by a computer to implement the method for evaluating insulation performance of a submarine cable according to claim 1.

10. An apparatus for evaluating insulation performance of a submarine cable, comprising an information obtaining module, a data solving module, and a first evaluation module, wherein the information obtaining module is configured to obtain a first measured dielectric loss value, first current-limiting resistance, and first insulation resistance of a submarine cable;

the data solving module is configured to substitute the first measured dielectric loss value, the first current-limiting resistance, and the first insulation resistance into an expression of the first measured dielectric loss value to calculate a first actual dielectric loss value, wherein the expression of the first measured dielectric loss value is calculated based on a preset expression of a total dielectric loss value, the expression of the total dielectric loss value comprises a first product and the to-be-solved first actual dielectric loss value, the first product is calculated by a preset model in an $n^{th}$-order situation, the $n^{th}$-order situation represents that there are n branches in the submarine cable, and the n is a natural number; and the first evaluation module is configured to evaluate insulation performance of the submarine cable based on the first actual dielectric loss value to obtain an insulation performance evaluation result.

11. The apparatus for evaluating insulation performance of a submarine cable according to claim 10, wherein the data solving module further comprises a first transformation unit, a second transformation unit, and a third transformation unit, wherein the first transformation unit is configured to establish an expression related to a frequency domain and impedance based on first preset data, and perform formula transformation on the expression related to the frequency domain and the impedance to obtain an initial frequency domain admittance expression, wherein the first preset data comprises a preset first measured dielectric loss value, preset total cable resistance, preset total cable capacitance, preset current-limiting resistance, an imaginary unit, an angular frequency under a direct current, and preset insulation resistance that are of the submarine cable;

the second transformation unit is configured to transform the initial frequency domain admittance expression into a complex number algebraic form to obtain a first frequency domain admittance expression containing a first real part and a first imaginary part; and the third transformation unit is configured to calculate the expression of the total dielectric loss value based on the first real part and the first imaginary part, and substitute a value of the first product into the expression of the total dielectric loss value to calculate the expression of the first measured dielectric loss value; wherein the first product is a product of the first real part and the preset current-limiting resistance.

12. The apparatus for evaluating insulation performance of a submarine cable according to claim 11, wherein the data solving module further comprises a first product unit; and the first product unit is configured to calculate the first product in the $n^{th}$-order situation by a Debye model, wherein the first product is as follows:

$$AR = \frac{R}{R_0} + \sum_{1}^{n} \frac{\omega^2 C_i^2 R_i R}{1 + \omega^2 C_i^2 R_i^2} = \frac{R}{R_0} + \sum_{1}^{n} \frac{\omega^2 C_i^2 R_i R}{1 + \omega^2 C_i^2 R_i^2} \cdot \frac{R_i}{R_i} \approx \frac{R}{R_{DC}}$$

wherein A represents the first real part, $R_0$, R, ω, and $R_{DC}$ respectively represent the preset total cable resistance, the preset current-limiting resistance, the angular frequency, and the preset insulation resistance in the first preset data, and $C_i$ and $R_i$ respectively represent equivalent capacitance and equivalent resistance of an $i^{th}$ branch in the submarine cable.

13. The apparatus for evaluating insulation performance of a submarine cable according to claim 11, wherein the expression of the total dielectric loss value is specifically as follows:

$$\tan\delta_{total} = (AR + 1)\tan\delta + \frac{AR}{\tan\delta}$$

wherein tan $\delta_{total}$ represents the preset first measured dielectric loss value, AR represents the first product, and tan δ represents the to-be-solved first actual dielectric loss value.

14. The apparatus for evaluating insulation performance of a submarine cable according to claim 11, wherein the initial frequency domain admittance expression is specifically as follows:

$$G(\omega) = \frac{R_0 + R + \omega^2 C_0^2 R_0^2 R + j\omega C_0 R_0^2}{(R_0 + R)^2 + \omega^2 C_0^2 R_0^2 R^2}$$

wherein $R_0$, $C_0$, R, ω, and j respectively represent the preset total cable resistance, the preset total cable capacitance, the preset current-limiting resistance, the angular frequency, and the imaginary unit in the first preset data.

15. The apparatus for evaluating insulation performance of a submarine cable according to claim 10, further comprising a determining module, a data obtaining module, and a second evaluation module, wherein the determining module is configured to determine whether there is a branch in the submarine cable;

the data obtaining module is configured to: when there is the branch, obtain the first measured dielectric loss value, the first current-limiting resistance, and the first insulation resistance of the submarine cable;

the second evaluation module is configured to: when there is no branch, obtain a second measured dielectric loss value, second current-limiting resistance, and second cable resistance of the submarine cable;

the second evaluation module is further configured to substitute the second measured dielectric loss value, the second current-limiting resistance, and the second cable resistance into an expression of the second measured dielectric loss value to calculate a second actual dielectric loss value, wherein the expression of the second measured dielectric loss value is calculated based on a preset second frequency domain admittance expression; and the second evaluation module is further configured to evaluate the insulation performance of the submarine cable based on the second actual dielectric loss value to obtain an insulation performance evaluation result.

16. The apparatus for evaluating insulation performance of a submarine cable according to claim 15, wherein the second evaluation module further comprises a fourth transformation unit, a fifth transformation unit, and a sixth transformation unit, wherein the fourth transformation unit is configured to establish an expression related to a frequency domain and impedance based on second preset data, and perform formula transformation on the expression related to the frequency domain and the impedance to obtain an initial frequency domain admittance expression, wherein the second preset data comprises a preset second measured dielectric loss value, preset cable resistance, preset cable capacitance, preset current-limiting resistance, an angular frequency under a direct current, and an imaginary unit that are of the submarine cable;

the fifth transformation unit is configured to transform the initial frequency domain admittance expression into a functional expression comprising a portion without the imaginary unit and another portion with the imaginary unit, to obtain the second frequency domain admittance expression containing a second real part and a second imaginary part; and the sixth transformation unit is configured to calculate the expression of the second measured dielectric loss value based on the second real part and the second imaginary part.

17. The apparatus for evaluating insulation performance of a submarine cable according to claim 16, wherein the expression of the second measured dielectric loss value is specifically as follows:

$$\tan\delta_{system} = \tan\delta' + \frac{R}{R_0 \tan\delta'}$$

wherein $\tan\delta_{system}$, R, and $R_0$ respectively represent the preset second measured dielectric loss value, the preset current-limiting resistance, and the preset cable resistance in the second preset data, and $\tan\delta'$ represents the to-be-solved second actual dielectric loss value.

* * * * *